United States Patent [19]

Martinetti et al.

[11] Patent Number: 4,595,892

[45] Date of Patent: Jun. 17, 1986

[54] COAXIAL CAVITY RESONATOR HAVING A DIELECTRIC INSERT WHICH IMPEDANCE MATCHES ACTIVE DEVICE USEABLE WITH RESONATOR

[75] Inventors: James L. Martinetti, Hudson County; Allen Katz, Mercer County, both of N.J.

[73] Assignee: RCA Corporation, Princeton, N.J.

[21] Appl. No.: 598,733

[22] Filed: Apr. 10, 1984

[51] Int. Cl.⁴ .......................... H03B 19/00; H01P 7/04
[52] U.S. Cl. ................................................... 333/218
[58] Field of Search ............................... 333/222–226, 333/218, 219, 235, 202, 206, 207, 263, 250; 331/96, 101, 107 DP

[56] References Cited

U.S. PATENT DOCUMENTS

| | | | |
|---|---|---|---|
| 3,353,087 | 11/1967 | Murphy et al. ................. | 333/218 |
| 3,525,057 | 8/1970 | Beeson ............................ | 333/263 X |
| 3,691,479 | 9/1972 | Malcolm ......................... | 331/96 X |
| 3,872,412 | 3/1975 | Seidel ............................. | 333/207 X |
| 4,059,815 | 11/1977 | Makimoto et al. ............. | 333/202 X |
| 4,389,624 | 6/1983 | Aihara ............................ | 333/207 X |

FOREIGN PATENT DOCUMENTS 0038744 3/1979 Japan ................................. 333/222

Primary Examiner—Eugene R. LaRoche
Assistant Examiner—Benny T. Lee
Attorney, Agent, or Firm—Joseph S. Tripoli; Robert L. Troike

[57] ABSTRACT

The tuning of a coaxial cavity resonator to match the characteristics of the diode is achieved by changing the amount of the dielectric in the cavity resonator. The diode is heat sunk to a short in the cavity. The cavity is of fixed length. A washer-like dielectric ring is added in the cavity to adjust the cavity reactance to match the diode for maximum power output.

4 Claims, 3 Drawing Figures

COAXIAL CAVITY RESONATOR HAVING A DIELECTRIC INSERT WHICH IMPEDANCE MATCHES ACTIVE DEVICE USEABLE WITH RESONATOR

This invention relates to coaxial cavities and more particularly to a tunable fixed length coaxial cavity resonator.

Coaxial type resonators with a diode or other active device are well known in the state of the art. Such resonators include an outer conductor and a center conductor coaxial with the outer conductor with one end of the resonator connected to an active device and the opposite end terminated in a short. In conventional systems the tuning of the diode or active device is accomplished by a sliding short at the end opposite the active device that slides between the inner and outer conductor and tunes the length of the cavity. In some applications, however, this type of tunable short may be difficult to access or the space requirements may not allow for such a variable length cavity. Also for vibration purposes it may be desirable to have some means other than a mechanical tuning short in order to adjust the desired resonant frequency and the matching to the active device. It is further desirable to have some means for heat sinking the diode or active device.

SUMMARY OF THE INVENTION

In accordance with one embodiment of the present invention the coaxial tuner, in series with and for tuning an active device while heat sinking the device, comprises a fixed length of coaxial line having a center conductor and an outer conductor with the center conductor coupled at one end in series with the active device and terminated at the opposite end in a heat sinking short across the center conductor and outer conductor. The fixed length of the coaxial line is selected to resonate at about the desired input frequency. A preformed solid ring of dielectric material having an outer diameter and inner diameter sized to fit between the center conductor and outer conductor is disposed in the cavity adjacent the termination. The length of the ring and the dielectric constant of the material is selected to match the impedance characteristics of the active device at the input frequency.

DESCRIPTION OF THE PREFERRED EMBODIMENT

Figure 1:
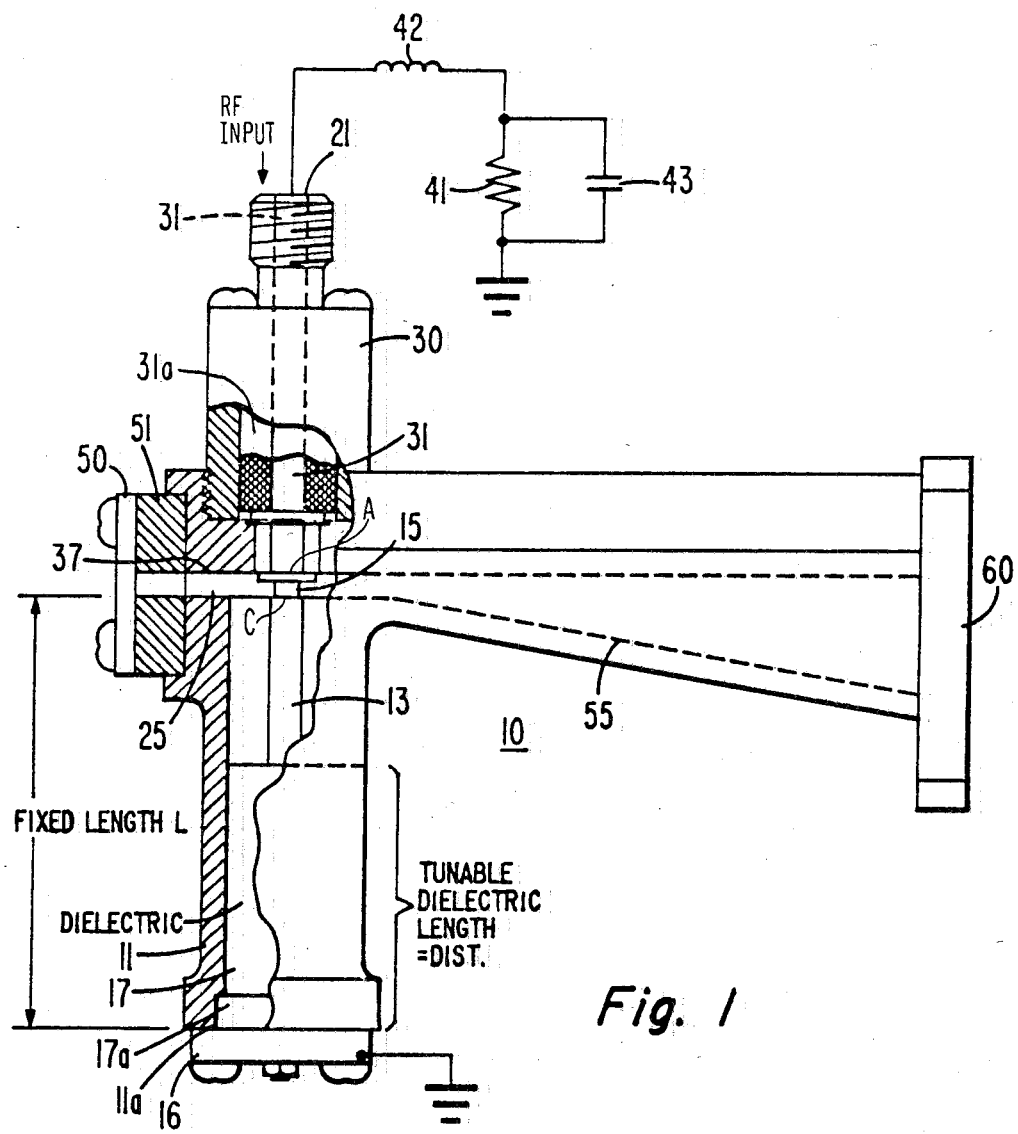
FIG. 1 is a side elevation view of a multiplier including a cavity resonator according to one embodiment of the present invention with parts of the multiplier removed to illustrate the diode and the tuning element.

Referring to FIG. 1 there is illustrated a times three (x3) frequency multiplier 10 using a tunable input coaxial cavity resonator according to the present invention. The coaxial cavity resonator comprises a grounded outer conductor 11 and a coaxial inner conductor 13. The inner conductor 13 is coupled at one end to a step recovery diode 15 and at the opposite to the outer conductor via a covering conductive shorting plate 16. The plate 16 covers the entire end of the resonator. The cathode C of the diode 15 is coupled to the center conductor 13 and the anode is coupled via a center conductor 31 of a coaxial line 30 to terminal 21. An input frequency of 3 GHz (gigahertz), for example, is applied at terminal 21 of line 30. The line 30 with its outer conductor and dielectric spacer 31a has a characteristic impedance of, for example, 35 ohms to transfer the 50 ohm impedance at terminal to the 24 ohm diode impedance. The diode 15 is located and centralized in the middle of the width of a reduced height rectangular waveguide section 25 for exciting in the waveguide 25 a signal at a third harmonic (12 GHz) of the input frequency.

Figure 2:
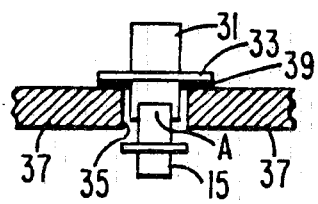
FIG. 2 illustrates in more detail the mounting of the diode to the waveguide in FIG. 1.

As shown in FIG. 2, the anode A of the diode is connected to the center conductor 31 of line 30 which extends in spaced manner through aperture 35 in the top wall 37 of reduced height rectangular waveguide section 25. The center conductor 31 includes a circular flange 33 and is spaced from the wall 37 by a ring-shaped dielectric body 39. The flange 33, waveguide top wall 37 and dielectric body 39 form a bypass capacitor which acts as an open for the incoming 4 GHz input frequency signals and as a short for the 12 GHz harmonic output frequency signals. This isolates terminal 21 from the x3 multiple output signals at 12 GHz. The dc bias for the diode 15 is provided by the diode rectified current across resistor 41. The DC bias circuit is shown schematically in FIG. 1 and is connected to the center conductor 31 at terminal 21 which carries the rectified DC current bias to the diode. Physically, the DC connection can be made anywhere along the line even at the source connected end. Resistor 41 and RF choke 42 are coupled in series to the center conductor 31 of input transmission line 30 which is coupled to ground via plate 16. Capacitor 43 is a bypass capacitor. The RF is isolated from the bias circuit by the RF choke 42 and bypass capacitor 43.

The coaxial cavity from the connection to the cathode at point C to the end of the cavity at plate 16 is of a fixed length L that is one-quarter wavelength resonant at the input frequency of 4 GHz. For the example, L=1.087 inches. The diode 15 is heat sunk by its connect from the center conductor 13 to the ground short at plate 16.

Figure 3:
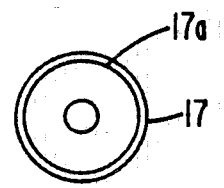
FIG. 3 is an end view of the tuning dielectric ring in accordance with one embodiment of the present invention.

In accordance with the present invention a dielectric ring 17 as illustrated in end view in FIG. 3 is adapted to fit between the center conductor 13 and outer conductor 11 and is placed adjacent the shorting plate 16 to provide tuning adjustment so as to match the impedance characteristic of the diode 15 at the input frequency to maximize coupling to the diode. As noted from the Table 1 below, by selecting the length of the dielectric ring from zero or no dielectric ring to a full length L ring the impedance can be changed from a capacitive reactance to an inductive reactance impedance value or from −j49.492 ohms to +j30.198 ohms. The distances in the table are relative to the total length of the cavity. The dielectric material was Teflon with a dielectric constant of about 2.2.

TABLE 1

| DIST | REAL | IMAG |
|---|---|---|
| 0 | 0 | −49.492 |
| .1 | 0 | −46.013 |
| .2 | 0 | −38.022 |
| .3 | 0 | −84.79 |
| .4 | 0 | −8.2361 |
| .5 | 0 | 7.5846 |
| .6 | 0 | 19.259 |

TABLE 1-continued

| DIST | REAL | IMAG |
|------|------|--------|
| .7   | 0    | 25.937 |
| .8   | 0    | 28.768 |
| .9   | 0    | 29.575 |
| 1    | 0    | 30.198 |

In this manner by changing the length of the dielectric ring 17 the impedance of the cavity resonator can be matched to the diode or active device impedance without changing the physical length of the cavity. The ring 17 has a flange portion (illustrated as 17a) at one end adapted to fit in an annular groove 11a in the outer conductor at the shorting plate 16 end so as to lock the ring 17 at the shorting end as shown.

The third harmonic frequency is maximized by the reactive tuning provided by the covering end short 50 across one end of the reduced height waveguide 25. This short is located between ¼ and ½ wavelength from the diode at the desired harmonic frequency of 12 GHz. The length of this short from the diode is adjusted by changing the length of waveguide section 51 to achieve the appropriate reactance in parallel with the diode. The opposite end of the reduced height waveguide 25 is coupled to a full height waveguide 60 by a linear tapered waveguide section 55.

What is claimed is:

1. A tunable coaxial cavity resonator in series with and for tuning an active device to receive input signals at a desired input frequency while heat sinking the active device comprising:
    a fixed length of coaxial line having center and outer conductors with the center conductor coupled at one end in series with the active device and with said coaxial line terminated at the opposite end in a heat sinking conductive short termination across said center and outer conductors, the fixed length of said coaxial line being selected with the device to resonate at about the desired input frequency, and
    a preformed solid ring of dielectric material having an outer diameter and inner diameter sized to fit between said center and outer conductors and disposed in said cavity resonator between said center and outer conductors adjacent said termination, the length of said ring along said coaxial line from said termination toward said active device coupled end and the dielectric constant of said ring material in said coaxial line being selected so the reactive impedance of said resonator matches the reactive impedance characteristic of the active device at the input frequency.

2. The resonator of claim 1 wherein the fixed length of said resonator is selected so the electrical length in the resonator is one quarter wavelength long at the desired input frequency.

3. A frequency multiplier for producing a desired harmonic output frequency signal of an input frequency signal comprising:
    a waveguide capable of supporting said output frequency;
    an active device;
    a coaxial resonator including an inner conductor and an outer coaxial conductor with one end of the inner conductor coupled to the active device and the second opposite end shorted to the outer conductor by a heat sinking conductive covering plate connected across and shorting said inner and outer conductors, said resonator resonant at an input frequency which is a subharmonic of said desired output frequency;
    means for coupling said active device in series with said coaxial cavity resonator at said input frequency and across said waveguide at said output frequency;
    a preformed dielectric ring sized to fit between said inner conductor and outer conductor positioned in said cavity adjacent said heat sinking plate, the length of said ring along said resonator from said heat sinking plate toward said active device coupled end and its dielectric constant being selected such that the reactive impedance of the resonator matches that of the active device at the input frequency; and
    said waveguide terminated at one end by a short at a distance to maximize the output at said desired harmonic output frequency.

4. The combination of claim 3 wherein said active device is a diode, said input signals are applied to said diode by a coaxial line in series with said diode and the resonator with said diode connected at said input frequencies between the center conductors of said coaxial line and the center conductor of said coaxial resonator.

* * * * *